United States Patent [19]

Ueba et al.

[11] Patent Number: 5,538,763
[45] Date of Patent: Jul. 23, 1996

[54] METHOD OF PREPARING CARBON CLUSTER FILM HAVING ELECTRICAL CONDUCTIVITY

[75] Inventors: Yoshinobu Ueba; Nobuyuki Okuda; Kengo Ohkura; Hirokazu Kugai, all of Osaka, Japan

[73] Assignee: Sumitomo Electric Industries, Ltd., Osaka, Japan

[21] Appl. No.: 348,740

[22] Filed: Dec. 2, 1994

Related U.S. Application Data

[62] Division of Ser. No. 963,826, Oct. 20, 1993, Pat. No. 5,380,595.

[30] Foreign Application Priority Data

Oct. 25, 1991 [JP] Japan ................................. 3-279794

[51] Int. Cl.⁶ ............................................... B05D 3/06
[52] U.S. Cl. ..................... 427/523; 427/249; 427/122; 505/460; 423/446; 423/DIG. 39
[58] Field of Search ................. 505/460; 427/523, 427/249, 122; 423/446, DIG. 39; 428/408

[56] References Cited

U.S. PATENT DOCUMENTS

| | | | |
|---|---|---|---|
| 5,271,890 | 12/1993 | Shimura et al. | 419/11 |
| 5,328,676 | 7/1994 | Gruen | 423/446 |
| 5,332,723 | 7/1994 | Eidelloth et al. | 505/125 |
| 5,370,855 | 12/1994 | Gruen | 423/446 |
| 5,393,572 | 2/1995 | Dearnaley | 427/523 |

OTHER PUBLICATIONS

Fullerenes by R. Curl et al., Oct. 1991 Scientific American No. 4, pp. 32–41.
Ion Implantation of Diamond–Like Films by Z. Zhihao et al. May 1989, Extended Abstracts, p. 127.
Formation of Fullerides and Fullerene–Based Heterostructures by D. Poirier et al., Aug. 1991, Science vol. 253, No. 9, pp. 646–648.
"Conducting Films of $C_{60}$ and $C_{70}$ by alkali–metal doping" by Haddon et al., Nature, vol. 350, pp. 320–322, Mar. 28, 1991.
"Superconductivity at 18 K in potassium–doped $C_{60}$", by Hebard et al., Nature, vol. 350, pp. 600–601, Apr. 18, 1991.
Kochanski et al. "Electrical Resistivity and Stoichiometry of $K_xC_{60}$ Films" Science, vol. 255, 10 Jan. 1992, pp. 184–186.
Benning et al. "$C_{60}$ and $C_{70}$ fullerenes and potassium fullerides", Phys. Review B. vol. 45, No. 12, pp. 6899–6913, 1992.
Stepniak et al. "Metallic and insulating phases of $Li_xC_{60}$, $Na_xC_{60}$, and $Rb_xC_{60}$" Phys. Review B. vol. 45, No. 11, pp. 6348–6351, Mar. 1992.
Kroto et al. "$C_{60}$ Buckminsterfullerene", Nature, vol. 318 14 Nov. 1985, pp. 162–163.
Curl et al. "Proving $C_{60}$" Science, vol. 242, Nov. 1988; pp. 1017–1022.
Krätschmer et al. "Solid $C_{60}$: a new form of carbon" Nature vol. 347, Sep. 1990, pp. 354–358.
Hannay et al. "Superconductivity in Graphitic Compounds", Phys. Rev. Letter., vol. 14, No. 7, 15 Feb. 1965, pp. 225–226.

*Primary Examiner*—Roy V. King
*Attorney, Agent, or Firm*—W. G. Fasse; W. F. Fasse

[57] ABSTRACT

A carbon cluster film has a precisely controlled stable electrical conductivity which does not deteriorate in a short period of time in air. Such a carbon cluster film having a stable electrical conductivity is formed by introducing an impurity into a thin film of fullerenes by ion implantation. The fullerenes include $C_{60}$, $C_{70}$ or the like.

21 Claims, No Drawings

METHOD OF PREPARING CARBON CLUSTER FILM HAVING ELECTRICAL CONDUCTIVITY

CROSS-REFERENCE TO RELATED APPLICATION

This application is a divisional of U.S. Ser. No. 07/963,826, filed Oct. 20, 1992, now U.S. Pat. No. 5,380,595, issued Jan. 10, 1995.

BACKGROUND OF THE INVENTION

1. Field of the Invention

The present invention relates to a method of preparing a carbon cluster film, and more particularly, a carbon cluster film which can stably maintain its electrical conductivity. A carbon cluster film is also described.

2. Background Information

There has recently been proposed a technique of doping by vacuum diffusion of an alkaline metal into a thin film of a carbon cluster such as $C_{60}$ or $C_{70}$, or so-called "fullerene", consisting of a certain number of carbon atoms linked with each other in the form of spheres such as soccer balls or spheroids such as Rugby balls, as described in articles by R. C. Haddon et al , Nature, Vol. 350, Mar. 28, 1991, pp. 320 to 322 and by A. F. Hebard et al. Nature, Vol. 350, Apr. 18, 1991, pp. 600 to 601. The former article reports that electrical conductivity values of 500 S/cm and 100 S/cm are obtained in $C_{60}$ thin films which are doped with potassium (K) and rubidium (Rb) by vacuum diffusion respectively, for example. On the other hand, the latter article reports that a $C_{60}$ thin film which is doped with potassium by vacuum diffusion exhibits superconductivity at a critical temperature Tc of 18 K. based on measurements of microwave absorption and magnetization, and at a critical temperature Tc of 16 K. based on a measurement of resistance. It is also reported that a $C_{60}$ thin film which is doped with rubidium exhibits superconductivity at a critical temperature Tc of 30 K.

There is such a possibility that a thin film which has an arbitrary conductivity ranging from an insulator to a superconductor can be prepared from the aforementioned carbon cluster by adjusting the amount of a doped alkaline metal. However, a thin film which is doped with an alkaline metal by vacuum diffusion in the aforementioned manner is so unstable in air that its electrical conductivity is reduced in a short time. This deterioration of the conductivity in air is believed to be due to the fact that the alkaline metal itself is highly reactive with oxygen and water as is well known in the art, and a compound formed by reaction with the carbon cluster which is doped with the alkaline metal by vacuum diffusion is so unstable that the same tends to react with oxygen and water contained in the air, for example, to cause decomposition.

In the aforementioned vacuum diffusion, further, it is difficult to precisely control the electrical conductivity even in vacuum since the amount of the alkaline metal which is doped in the thin film cannot be strictly or rather precisely controlled.

SUMMARY OF THE INVENTION

The present invention takes into consideration the aforementioned circumstances, and it is an object of the invention to provide a stable carbon cluster film having a precisely controlled electrical conductivity which will not deteriorate in a short time in atmospheric air.

In order to solve the aforementioned deterioration problem, a carbon cluster film according to the present invention is formed by introducing an impurity by ion implantation into a thin film which consists essentially of a carbon cluster having a π electron conjugate system.

According to the present invention, it is possible to obtain a carbon cluster film which is more stable in air than a conventional film. It has been found that there is no possibility of deterioration of the electrical conductivity over a short period of time, even if an unstable alkaline metal is ion-implanted as an impurity. When an element which is more stable than an alkaline metal is ion-implanted as an impurity, stability of the electrical conductivity of the present carbon cluster film is further improved. According to the present invention, the carbon cluster film having a stable electrical conductivity in atmospheric air is achieved, presumably because the impurity which is ion-implanted into the carbon cluster thin film in a high energy state forms a stable compound with the carbon cluster on the exterior of the aforementioned fullerene. The reason why the stable compound is formed however, has not been fully found out. There is also a possibility that the impurity enters the inside of the fullerene spheroid to form a compound that is stable in atmospheric air.

In the ion implantation, it is possible to very precisely control the amount of the impurity which is implanted into the thin film, by electrically monitoring the total amount of the implanted impurity ions. Additionally it is also possible to implant the impurity into the thin film to a desired depth by controlling the acceleration voltage of the ion beam, whereby the electrical conductivity of the carbon cluster film can be precisely controlled. Further, the aforementioned ion implantation has such an advantage that it is possible to freely control the electrical conductivity in any arbitrary area of the carbon cluster thin film by controlling the area to which the ion beam is applied.

In addition to the aforementioned $C_{60}$ and $C_{70}$ any carbon cluster can be used having a π electron conjugate system expressed as $C_{2n}$, where $10 \leq n \leq 100$. Such a carbon cluster is produced by burning hydrocarbon at a high temperature, or by subjecting graphite or carbon to resistance heating, to an arc discharge, laser beam heating, electron beam evaporation, magnetron sputtering or the like, under an inert gas atmosphere, and then, if necessary, by purifying the soot obtained by the above processes to a high purity of at least 99.9% by solvent extraction, column chromatography, or sublimation.

In order to form a thin film from the carbon cluster, a well known thin film forming method such as vacuum plating, a clusterion beam method, a molecular beam epitaxial (MBE) method, sputtering, a Langmuir-Blodgett's film method, solvent coating or the like may be applied to a raw material which is made of microcrystalline powder of a purified carbon cluster. When such a thin film forming method is combined with a well known patterning method such as masking, etching or printing, it is possible to form a carbon cluster thin film having a prescribed pattern in response to the shape of an element, a circuit or the like. Further, it is also possible to form a carbon cluster thin film having a crystalline structure through epitaxy.

The thin film is not particularly restricted in thickness but any arbitrary thickness can be selected in accordance with the intended use of the thin film. A substrate to be provided with the thin film is not particularly critical. The substrate may be made of any suitable material such as glass, quartz, diamond, a semiconductor such as silicon, GaAs, InP or ZnSe, or a ceramic material such as MoS, BN or $Al_2O_3$.

The impurity can be implanted into the aforementioned thin film by well known ion implantation techniques employing a general ion implantation apparatus. The ion-implanted impurity preferably serves as a donor or an acceptor for the carbon cluster. The impurity may alternatively be prepared from a noble gas element such as He, Ne, Ar, Kr or Xe. An impurity serving as a donor may be prepared from hydrogen atoms, an alkaline metal element such as Li, Na, K or Rb, an alkaline earth metal element such as Be, Mg, Ca, Sr or Ba, a transition element such as Fe, Co or Ni, a lanthanide element, an actinide element, an element belonging to the group IIIb of the periodic table such as B, Al, Ga or In, or an element belonging to the group IVb of the periodic table such as Ge, or Pb. An impurity serving as an acceptor may be prepared from an element belonging to the group IVb of the periodic table such as N, P, As or Sb a chalcogen element such as O, S, Se or Te, or a halogen element such as F, Cl, Br or I.

The dose amount of the impurity into the thin film may be arbitrarily adjusted in response to any target conductivity of the carbon cluster film, as hereinabove described. If the dose amount is too large, however, carbon cluster molecules may be cut or broken to deteriorate the film quality. Heretofore, it is preferable to set a favorable upper limit of the dose amount of the impurity in a range not causing such decomposition etc. Thereby taking into account the thickness of the carbon cluster film, the atomic weight of the ion-implanted impurity element, the implantation voltage and the like. When the carbon cluster thin film has a thickness of 1000 to 10000 Å and $N^+$ ions are implanted at an implantation voltage of 100 KeV, for example, the upper limit of the dose amount per 1 $cm^2$ of the thin film is preferably $10^{16}$ ions, while such an upper limit is preferably $10^{17}$ ions if $He^+$ ions are implanted into a thin film having the same thickness as the above at an implantation voltage of 1MeV, for example. The resistivity of the carbon cluster film obtained by such ion implantation, the value of which is influenced by the activation factor of the implanted element, can be set at a value of not more than $10^4$ $\Omega$·cm, for example.

The acceleration voltage of the ion beam determines the depth of implantation of the impurity, as hereinabove described. While the acceleration voltage and the depth of implantation are varied with the atomic weight of the ion-implanted impurity etc., an acceleration voltage of about 200 KeV at the maximum may be applied in order to ion-implant the impurity into the overall carbon cluster thin film having a thickness of 1000 to 10000 Å, for example.

According to the present invention, as described above, it is possible to obtain a stable carbon cluster film having a precisely controlled electrical conductivity ranging from a semiconductor to a conductor. Further, there is a possibility that a superconducting film can be formed by appropriately selecting the type of the impurity and ion implantation conditions, as described in the aforementioned articles.

In the present carbon cluster film, three-dimensional and isotropic ($C_{60}$) or anisotropic ($C_{70}$) characteristics can be expected based on the steric structure of the carbon cluster expressed as $C_{2n}$, particularly the structure of $C_{60}$ or $C_{70}$. In other words, it is possible to prepare a film which is controlled in its dimensions in relation to its electric characteristics, optical characteristics, electro-optic characteristics and the like by selecting the shapes of the $C_{2n}$ molecules. According to the present invention, $C_{60}$, $C_{70}$, $C_{76}$, $C_{78}$, $C_{80}$, $C_{82}$, $C_{84}$ or $C_{96}$ can be preferably employed as a carbon cluster having a fullerene structure.

According to the present invention, further, it is possible to form a p-type or n-type semiconductor with implantation of an acceptor or a donor, by selecting the type of the ion-implanted impurity. Thus, it is possible to easily manufacture an element having a p-n junction or a p-i-n junction by combining the formation of the carbon cluster film and the ion implantation. When the carbon cluster thin film is formed by a vapor phase method such as vacuum evaporation, the present element can be more easily manufactured since all the aforementioned steps can be carried out as dry processes in a vacuum. In order to form a p-n junction element, for example, a carbon cluster thin film may be formed on a substrate so that an impurity serving as a donor is ion-implanted into this thin film to form a p-type semiconductor layer, and another carbon cluster thin film is formed thereon so that an impurity serving as an acceptor is ion-implanted into this film to form an n-type semiconductor layer. In order to form a p-i-n junction element, on the other hand, an insulating layer may be formed between such p-type and n-type semiconductor layers.

Also when a carbon cluster film exhibiting superconductivity is employed, it is possible to manufacture a superconducting element by combining the formation of a carbon cluster film and ion implantation. For example, an SIS junction can be formed by interposing an insulating layer between two superconducting layers, while an SMS junction can be formed by interposing a metal layer between the superconducting layers.

The foregoing and other objects, features, aspects and advantages of the present invention will become more apparent from the following detailed description of the present invention.

DESCRIPTION OF THE PREFERRED EMBODIMENT

The present invention will now be described on the basis of Examples.

EXAMPLE 1

A commercially available $C_{60}/C_{70}$ carbon cluster was purified through a column chromatograph with a neutral alumina serving as a column packing material and a mixed solvent containing hexane and benzene in the ratio of 95:5, and thereafter vacuum-dried at 200° C. to obtain a $C_{60}$ carbon cluster of 99.9% purity in the form of microcrystalline powder.

Then, this $C_{60}$ carbon cluster was evaporated on a surface of a glass substrate of 10 mm by 20 mm by 0.5 mm by vacuum evaporation, to form a transparent pale yellow carbon cluster thin film of 5000 Å in thickness. The vacuum evaporation was carried out under conditions of a degree of vacuum of $10^{-5}$ to $10^{-8}$ Torr, an evaporation source temperature of 300° C. and an evaporation source-to-substrate distance of 7.5 cm.

Then $N^+$ ions were implanted into the aforementioned thin film by ion implantation using an acceleration voltage of 100 KeV, to measure the relationship between the dose amount and the resistivity. As a result, it was found that the resistivity of the carbon cluster film was reduced as the dose amount of the $N^+$ ions was increased, as shown in Table 1. When the obtained carbon cluster film was left under atmospheric air at room temperature, the resistivity of the film remained unchanged for at least one month.

TABLE 1

| Dose Amount (ions/cm$^2$) | 10$^{11}$ | 10$^{13}$ | 10$^{15}$ |
|---|---|---|---|
| Resistivity ($\Omega \cdot$ cm) | 10 | 1 | 10$^{-2}$ |

EXAMPLE 2

The microcrystalline powder of $C_{60}$ carbon cluster purified as in Example 1 was evaporated on a surface of a diamond substrate by vacuum evaporation, to form a transparent pale yellow carbon cluster thin film of 5 μm in thickness under the same vacuum evaporation conditions as in Example 1.

Then, He$^+$ ions were implanted into the aforementioned thin film by an acceleration voltage of 1 MeV, to measure the relationship between the dose amount and the resistivity. As a result, it was found that the resistivity of the carbon cluster was reduced as the dose amount of the He$^+$ ions was increased, as shown in Table 2. When the obtained carbon cluster film was left in atmospheric air at room temperature, the resistivity of the film remained unchanged for at least one month.

TABLE 2

| Dose Amount (ions/cm$^2$) | 10$^{11}$ | 10$^{13}$ |
|---|---|---|
| Resistivity ($\Omega \cdot$ cm) | 10 | 10$^{-1}$ |

EXAMPLE 3

A $C_{60}$ carbon cluster was obtained by carrying out a purification similarly to Example 1. The obtained carbon cluster was deposited on a quartz glass substrate by ion beam deposition, to form a transparent pale yellow $C_{60}$ carbon cluster thin film having a thickness of about 3000 Å, under these conditions: a degree of vacuum of 10$^{-6}$ to 10$^{-7}$ Torr, an evaporation source temperature of 300° C., an ionization voltage of 25 V, and an acceleration voltage of 100 V.

Then, boron ions were implanted into the carbon cluster thin film under a condition of an acceleration voltage of 200 KeV with a density of 10$^{15}$/cm$^2$ to obtain a carbon cluster thin film having a resistivity of 10$^{-1}$ $\Omega$·cm. The resistivity of the carbon cluster thin film was stable for at least one month in atmospheric air at room temperature.

EXAMPLE 4

Commercially available $C_{60}$ microcrystalline powder purified to more than 99% was washed with tetrahydrofuran. Most part of the tetrahydrofuran was removed by centrifugation from the powder. A purified carbon cluster was obtained by vacuum drying at 200° C. The as-obtained carbon cluster was employed as an evaporation source, to form $C_{60}$ carbon cluster thin films of 1000 Å in thickness on a ZnSe (100) substrate, a GaAs (100) substrate, and an Si (111) substrate by molecular beam epitaxy, respectively. These thin films were formed under these conditions: a degree of vacuum of 10$^{-8}$ to 10$^{-9}$ Torr, an evaporation source (K cell) temperature of 200° to 300° C., a film forming rate of 0.1 Å/s, and a substrate temperature of 25° C. The as-obtained thin films were subjected to X-ray diffraction (XRD), whereby clear fcc crystal peaks were observed. In the X-ray diffraction, the carbon cluster thin films formed on the ZnSe, GaAs and Si substrates exhibited an fcc (111) peak having FWHM (full width at half maximum) of 0.93°, 1.15° and 1.26° respectively. Then, a four-probe lead wire for measuring the resistance was mounted with Ag paste on the $C_{60}$ thin film which was formed on the GaAs (100) substrate. Thereafter, Rb ions were implanted into this thin film at an acceleration voltage of 20 KeV. The resistivity of the ion-implanted thin film was measured in a vacuum at 25° C., whereby a value of 2×10$^{-2}$ $\Omega$·cm was obtained. Then, the substrate provided with the thin film was left in dry air, to investigate any resistance change. No resistance change was observed in this thin film at least for 6 hours. On the other hand, a $C_{60}$ thin film which was doped with Rb by vacuum diffusion in place of ion implantation exhibited a resistivity of 5×10$^{-3}$ $\Omega$·cm in a vacuum at room temperature. When this Rb doped thin film was left in dry air, however, the resistance immediately exceeded 10$^8$$\Omega$, to exhibit an insulating property. Through the aforementioned experiments, it has been found that the present carbon cluster thin film which is doped with an impurity by ion implantation is remarkably stable in its conductivity as compared with a conventional doped thin film.

According to the present invention, an impurity is implanted into a carbon cluster thin film by ion implantation, whereby it is possible to obtain a stable carbon cluster film having a precisely controlled electrical conductivity, which will not be deteriorated in a short period of time in air. Thus, there is a possibility that the present carbon cluster film can be applied to various fields of a semiconductor device, a superconducting device and the like by appropriately selecting the type of the implanted impurity and implantation conditions and suitably combining the ion implantation step with another step, to attain a high industrial value.

Although the present invention has been described in detail, it is clearly understood that the same is by way of illustration and example only and is not to be taken by way of limitation, the spirit and scope of the present invention being limited only by the terms of the appended claims.

What is claimed is:

1. A method of preparing an element including a carbon cluster film having an electrical conductivity, comprising:

a) forming on a substrate a thin film consisting essentially of a carbon cluster material having a π electron conjugate system; and b) introducing an impurity into said thin film by ion implantation.

2. The method of claim 1, wherein said forming of said thin film comprises vacuum plating, ion beam deposition or molecular beam epitaxy.

3. The method of claim 1, wherein said forming of said thin film is carried out so that said thin film has a crystalline structure.

4. The method of claim 1, further comprising a preliminary step of preparing said carbon cluster material by burning, heating, evaporating or sputtering a hydrocarbon or carbon material to form a carbon soot and then forming a microcrystalline powder of said carbon soot.

5. The method of claim 4, wherein said preparing of said carbon cluster material further comprises purifying said carbon soot to a purity of at least 99.9% by solvent extraction, column chromatography or sublimation.

6. The method of claim 1, wherein said ion implantation is carried out for forming a stable compound of said impurity with said carbon cluster material.

7. The method of claim 1, wherein said ion implantation is carried out for providing said electrical conductivity such that said electrical conductivity is maintained when said carbon cluster film is placed in atmospheric air.

8. The method of claim 1, wherein said ion implantation is carried out for providing said electrical conductivity such that said electrical conductivity is maintained when said carbon cluster film is at room temperature.

9. The method of claim 1, further comprising controlling said introducing of said impurity for achieving a target impurity dosage by electrically monitoring an implanted amount of said impurity.

10. The method of claim 9, wherein said target impurity dosage is less than about $10^{17}$ ions per cm$^2$ of a surface of said thin film treated by said ion implantation.

11. The method of claim 9, wherein said target impurity dosage is between about $10^{11}$ and $10^{15}$ ions per cm$^2$ of a surface of said thin film treated by said ion implantation.

12. The method of claim 1, further comprising adjusting the acceleration voltage of said ion implantation for adjusting the depth to which said impurity is implanted in said thin film to a selected depth and for adjusting said electrical conductivity to a selected conductivity.

13. The method of claim 1, wherein said electrical conductivity corresponds to a resistivity of not more than about $10^4$ Ωcm at room temperature.

14. The method of claim 1, wherein said impurity is selected and said ion implantation is controlled for forming said carbon cluster film as a superconducting carbon cluster film.

15. The method of claim 1, wherein said introducing of said impurity is carried out on a limited treatment area of said thin film being only a portion of an entire surface area of said thin film.

16. The method of claim 1, wherein said thin film formed in said step a) is a first thin film, and further comprising, after said step b), forming a second thin film on said first thin film, and then introducing a second impurity into said second thin film by ion implantation.

17. The method of claim 1, wherein said thin film formed in said step a) is a first thin film, and further comprising, after said step b), forming a second film on said first thin film, and then forming a third thin film on said second film, and then introducing a second impurity into said third thin film by ion implantation.

18. The method of claim 16, wherein said second thin film consists essentially of a carbon cluster material having a π electron conjugate system, said first thin film with said impurity exhibits a first conductivity, and said second thin film with said second impurity exhibits a second conductivity opposite said first conductivity.

19. The method of claim 17, wherein said second film is an insulating layer, said third thin film consists essentially of a carbon cluster material having a π electron conjugate system, said first thin film with said impurity exhibits a first conductivity, and said third thin film with said second impurity exhibits a second conductivity opposite said first conductivity.

20. The method of claim 17, wherein said second film is an insulating layer, said third thin film consists essentially of a carbon cluster material having a π electron conjugate system, and said first thin film with said impurity and said third thin film with said second impurity each exhibit superconductivity.

21. The method of claim 17, wherein said second film is a metal layer, said third thin film consists essentially of a carbon cluster material having a π electron conjugate system, and said first thin film with said impurity and said third thin film with said second impurity each exhibit superconductivity.

* * * * *

UNITED STATES PATENT AND TRADEMARK OFFICE
CERTIFICATE OF CORRECTION

PATENT NO. : 5,538,763

DATED : July 23, 1996

INVENTOR(S) : Yoshinobu Ueba et al.

It is certified that error appears in the above-identified patent and that said Letters Patent is hereby corrected as shown below:

On the Title Page:

Item: [62] replace "Oct. 20, 1993" by --Oct. 20, 1992--.

Column 3, line 16, replace "IVb" by --Vb--.

Column 6, line 2, after "respectively." insert a paragraph spacing.

Signed and Sealed this

Eighth Day of October, 1996

Attest:

BRUCE LEHMAN

Attesting Officer     Commissioner of Patents and Trademarks